United States Patent
Kang et al.

(10) Patent No.: US 7,192,531 B1
(45) Date of Patent: Mar. 20, 2007

(54) IN-SITU PLUG FILL

(75) Inventors: Sean S. Kang, Fremont, CA (US); Sangheon Lee, Milpitas, CA (US); Wan-Lin Chen, Sunnyvale, CA (US); Eric A. Hudson, Berkeley, CA (US); Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 573 days.

(21) Appl. No.: 10/603,412

(22) Filed: Jun. 24, 2003

(51) Int. Cl.
*H01L 21/302* (2006.01)

(52) U.S. Cl. .............................. 216/37; 216/17; 216/18; 216/67; 438/706; 438/738

(58) Field of Classification Search .................. 216/17, 216/18, 67, 37; 438/706, 738
See application file for complete search history.

(56) References Cited

U.S. PATENT DOCUMENTS

| | | | | |
|---|---|---|---|---|
| 5,493,146 | A | * | 2/1996 | Pramanik et al. ........... 257/530 |
| 5,501,893 | A | | 3/1996 | Laermer et al. ............. 428/161 |
| 6,037,249 | A | * | 3/2000 | Chiang et al. .............. 438/619 |
| 6,187,685 | B1 | | 2/2001 | Hopkins et al. ............. 438/710 |
| 6,261,962 | B1 | | 7/2001 | Bhardwaj et al. ........... 438/702 |
| 6,569,777 | B1 | * | 5/2003 | Hsu et al. .................... 438/725 |
| 6,764,810 | B2 | * | 7/2004 | Ma et al. ...................... 430/313 |
| 2001/0021581 | A1 | * | 9/2001 | Moon et al. ................. 438/637 |
| 2003/0151020 | A1 | * | 8/2003 | Lee et al. ....................... 252/2 |
| 2004/0192058 | A1 | * | 9/2004 | Chu et al. .................... 438/710 |

OTHER PUBLICATIONS

U.S. Appl. No. 09/972,765, filed Oct. 5, 2001, PN 6794293.
U.S. Appl. No. 10/138,041, filed May 1, 2002.

* cited by examiner

*Primary Examiner*—Shamim Ahmed
(74) *Attorney, Agent, or Firm*—Beyer Weaver & Thomas, LLP

(57) ABSTRACT

A method for forming damascene features in a dielectric layer over a barrier layer over a substrate is provided. A plurality of vias are etched in the dielectric layer to the barrier layer with a plasma etching process in the plasma processing chamber. A patterned photoresist layer is formed with a trench pattern. Within a single plasma process chamber a combination via plug deposition to form plugs in the vias over the barrier layer and trench etch is provided.

17 Claims, 15 Drawing Sheets

IN-SITU PLUG FILL

BACKGROUND OF THE INVENTION

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

The etching of dielectrics may be advantageously accomplished in a dual-frequency confined, (DFC) dielectric etch system. One such is Lam® Research model Exelan HP™ or an HPT™, which is basically the same as HP with a Turbo Pump attached to the chamber, available from Lam® Research Corporation, Fremont Calif. The Exelan HP™ system provides an extremely comprehensive dielectric etch portfolio in one system. Processes include contacts and vias, bi-level contacts, borderless contacts, nitride and oxide spacers, passivation, and dual damascene etch processes.

In semiconductor-based device (e.g., integrated circuits or flat panel displays) manufacturing, dual damascene structures may be used in conjunction with copper conductor material to reduce the RC delays associated with signal propagation in aluminum-based materials used in previous generation technologies. In dual damascene, instead of etching the conductor material, vias, and trenches may be etched into the dielectric material and filled with copper.

To facilitate discussion, FIG. 1A is a cross-sectional view of a stack 100 on a wafer 110 used in the dual damascene process of the prior art. A contact 104 may be placed in a dielectric layer 108 over a wafer 110. A barrier layer 112, which may be of silicon nitride or silicon carbide, may be placed over the contact 104 to prevent the copper diffusion. A via level silicon oxide dielectric layer 116 may be placed over the barrier layer 112. A trench stop layer 120 (silicon carbide or silicon nitride) may be placed over via level dielectric 116. A trench level silicon oxide dielectric layer 124 may be placed over the trench stop layer 120. An antireflective layer (ARL) 128 may be placed over the trench dielectric layer 124. A patterned resist layer 132 may be placed over the ARL 128. The ARL 128 may be formed from silicon nitride, SiON, or other material with a high refractive index and high extinction coefficient.

FIG. 2 is a high level flow chart of a process used in the prior art to form the stack 100 into a dual damascene structure. The stack 100 may be subjected to an etch, which etches a via 140 down to the barrier layer 112 (step 204). The etching of the via 140 may form a crust 144, which forms sidewalls. The crust 144 and resist 132 may be removed and subsequently repatterned with a new resist layer 160, which is patterned to form a trench (step 208), as shown in FIG. 1C. The stack may be subjected to an etch, which etches a trench 164 down to the intermediate trench etch stop layer 120 (step 212), as shown in FIG. 1D. The etching of the trench 164 may cause part of the via level dielectric layer 116 to facet 172. This faceting may be considered as damage to the dual damascene structure. The intermediate trench etch stop layer 120 may be used to reduce faceting. The etching of the trench 164 may also form a new crust 168, which forms sidewalls. The resist layer 160 and crust may then be stripped (step 216). The stack 100 may then be subjected to a barrier layer etch (step 220), which opens the via 140 to the copper contact 104, to provide the structure shown in FIG. 1E. A metal barrier layer 174 may be deposited over the copper contact (step 224), as shown in FIG. 1F. A copper seed layer 176 may then be used to coat the interior of the via and trench. Electroplating may be used to fill the trench and via with copper 178, which is polished down to the trench dielectric layer 124. The copper 178 may be used as a copper connect for the next level, so the process is repeated creating multiple levels of copper connects and dielectric layers.

Although the intermediate trench etch stop layer may be used to reduce faceting, providing and etching the intermediate trench etch stop layer requires additional processing steps, which increases processing time and costs.

In addition, integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. A number of promising materials, which are sometimes referred to as "low-k materials", have been developed. In the specification and claims, low-k materials are defined as materials with a dielectric constant k that is less than 4. Fluorosilicate glass is one example of a low-k dielectric, which has a dielectric constant of about 3.7. This composes an about 7–9% fluorine doped into $SiO_2$.

Another interesting class of low-k materials is compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the density, and hence the dielectric constant of the material. A dielectric constant for such films is typically <3.0.

To facilitate discussion, FIG. 3A is a cross-sectional view of part of a wafer in the production of a damascene structure without a trench stop layer and using a low-k dielectric. A contact 304 may be placed in a low-k dielectric layer 308 over a wafer 310. A second contact 306 may also be in the low-k dielectric layer 308. A dielectric barrier layer 312, typically, but not limited to, silicon nitride or silicon carbide, may be placed over the contact 304 to prevent copper diffusion. A low-k dielectric layer 320 may be placed over the barrier layer 312. An antireflective layer (ARL) 328 may be placed over the low-k dielectric layer 320. A patterned resist layer 332 may be placed over the ARL 328. The patterned resist layer 332 is patterned to provide a via 340, which is etched into the low-k dielectric layer 320. The resist layer 332 is removed and a second patterned resist layer 360 is placed over the ARL 328. The second resist layer 360 is patterned to provide a trench 364, which is etched into the low-k dielectric layer 320.

Because of the absence of the intermediate trench etch stop layer and the use of a low-k dielectric, faceting 372 in this example may be increased. Such faceting may cause the copper, which would be used to fill in the via and trench, to be too close to the second contact 306. This may also increase the dimension of the bottom of the via.

To facilitate understanding, FIG. 4A is a cross-sectional view of part of a wafer in the production of a damascene structure without a trench stop layer and using a low-k dielectric. A first contact 404 and a second contact 406 may be placed in a low-k dielectric layer 408 over a wafer 410. A dielectric barrier layer 412, typically, but not limited to, silicon nitride or silicon carbide, may be placed over the first and second contacts 404, 406 to prevent the copper diffusion. A low-k dielectric layer 420 may be placed over the barrier layer 412. First 440 and second 444 vias may be etched into the low-k dielectric layer 420. A bottom antireflective coating (BARC) layer 428 may be spun over the low-k dielectric layer 420. Such a spun on BARC tends to at least partially fill the vias 440, 444 and form sidewalls in the vias. Generally, thinner vias are filled with BARC to a higher depth than wider vias are filled. Also, more spread apart vias may be filled higher than more closely packed vias. As a result, it may be difficult to have the vias filled to a uniform height.

FIG. 4B is a cross-sectional view of part of the wafer after trenches 448, 452 have been etched. The presence of BARC in the vias creates fences 456, 460 and, in addition, faceting 462, 464. The amount of faceting and the size of the fences are dependent on the height of the BARC. Therefore, non-uniform BARC height may cause non-uniform faceting and fences. The fences may be a stress location, which may cause electro-migration, voids and other failures, which may diminish the reliability of the resulting semiconductor devices.

SUMMARY OF THE INVENTION

To achieve the foregoing and in accordance with the purpose of the present invention a method for forming damascene features in a dielectric layer over a barrier layer over a substrate is provided. A plurality of vias are etched in the dielectric layer to the barrier layer with a plasma etching process in the plasma processing chamber. A patterned photoresist layer is formed with a trench pattern. Within a single plasma process chamber a combination via plug deposition to form plugs in the vias over the barrier layer and trench etch is provided.

In another embodiment of the invention an apparatus for forming damascene features in a substrate is provided. A plasma processing chamber is provided. A gas source is connected to the plasma processing chamber, for providing a gas to the plasma processing chamber. A plasma excitation power source is connected to the plasma processing chamber for generating and maintaining a plasma within the processing chamber. A controller for controlling the gas source and the power source, comprising computer readable instructions, comprises computer code for signaling to the gas source to provide a via plug deposition gas from the gas source, computer code for signaling to the plasma excitation power source to provide power to transforming the via plug deposition gas into a plasma to form via plugs, which selectively deposits preferentially on bottoms of vias over sidewalls of vias, computer code for signaling to the gas source to provide a trench etching gas from the gas source, and computer code for signal to the gas source to provide a plug strip gas from the gas source after the trench etch is performed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

U.S. application Ser. No. 09/972,765 filed on Oct. 5, 2001, entitled "A Trench Etch Process for Low-k Dielectrics," by Li et al., which is incorporated by reference for all purposes, discusses a method of providing a damascene structure using a spin-on plug, where the resulting structure does not have a fence and is not terraced. Providing a spin-on plug and steps to eliminate the fence and terracing may add to the process time.

Figure 1A:
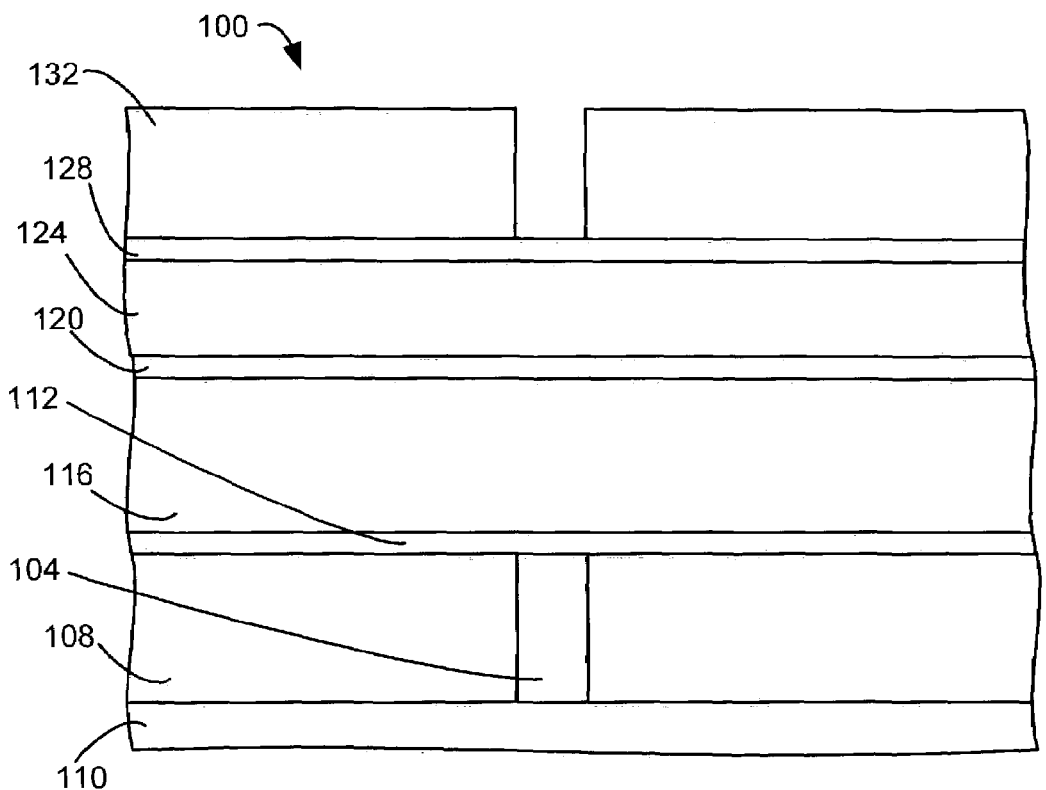
FIGS. 1A–F are schematic views of the formation of a damascene structure in the prior art.
Figure 1B:
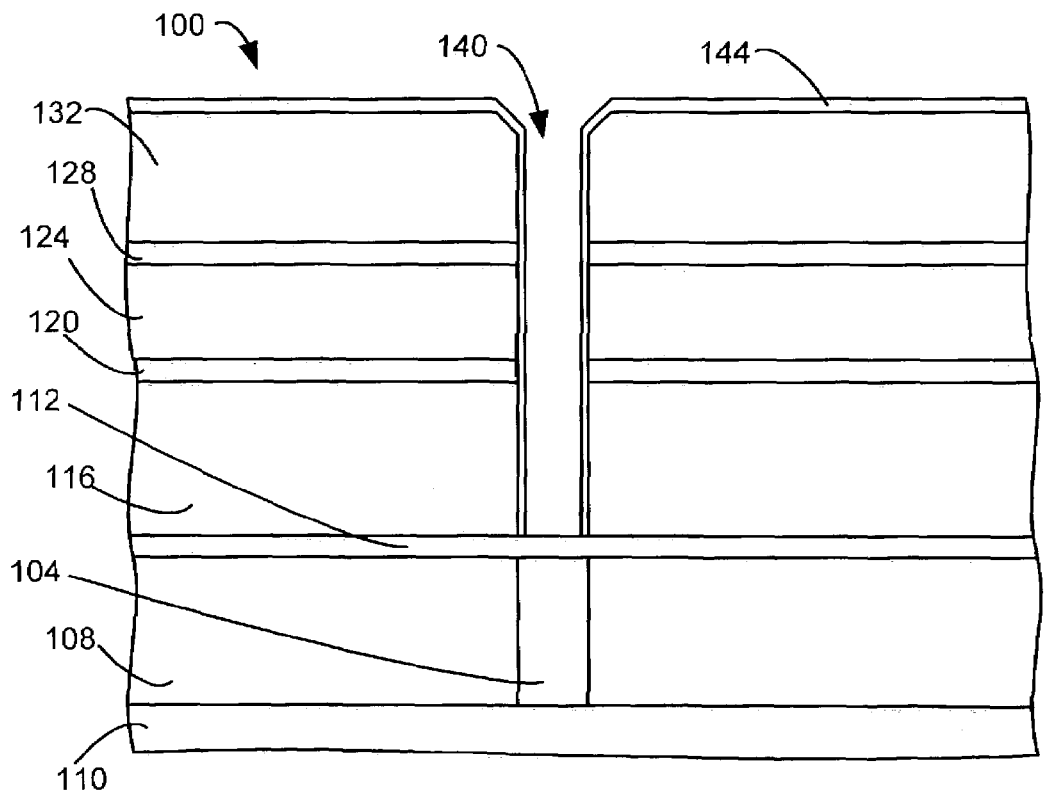
Figure 1C:
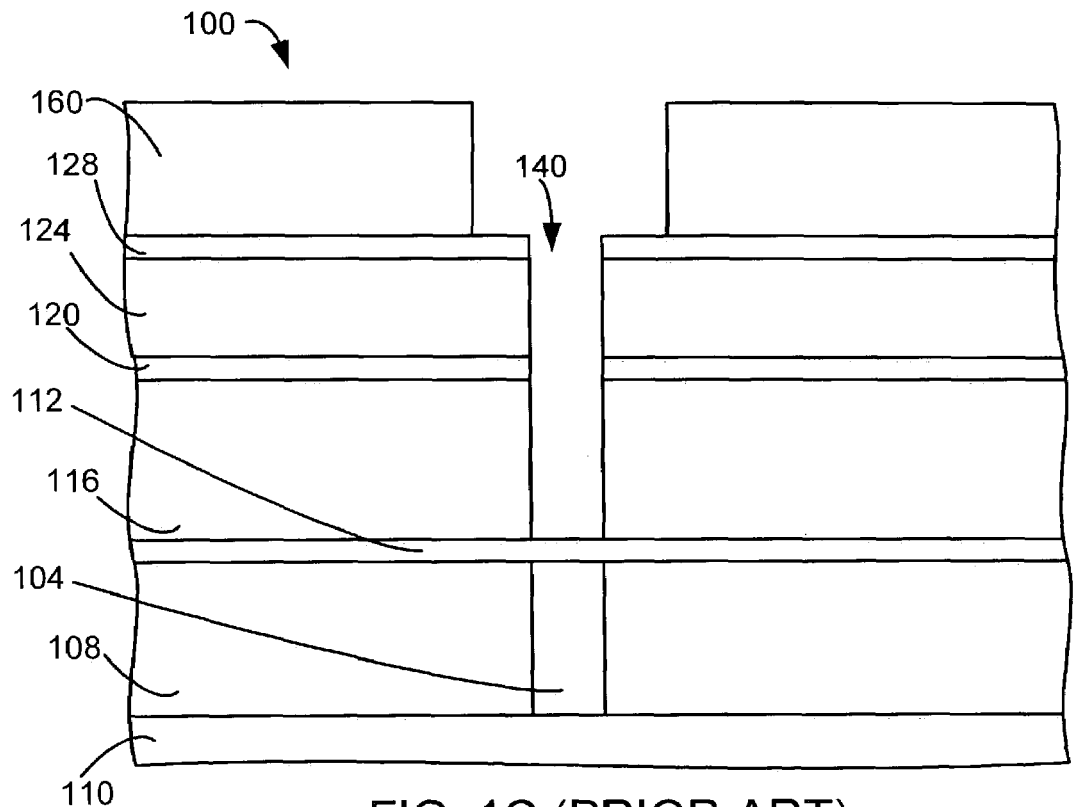
Figure 1D:
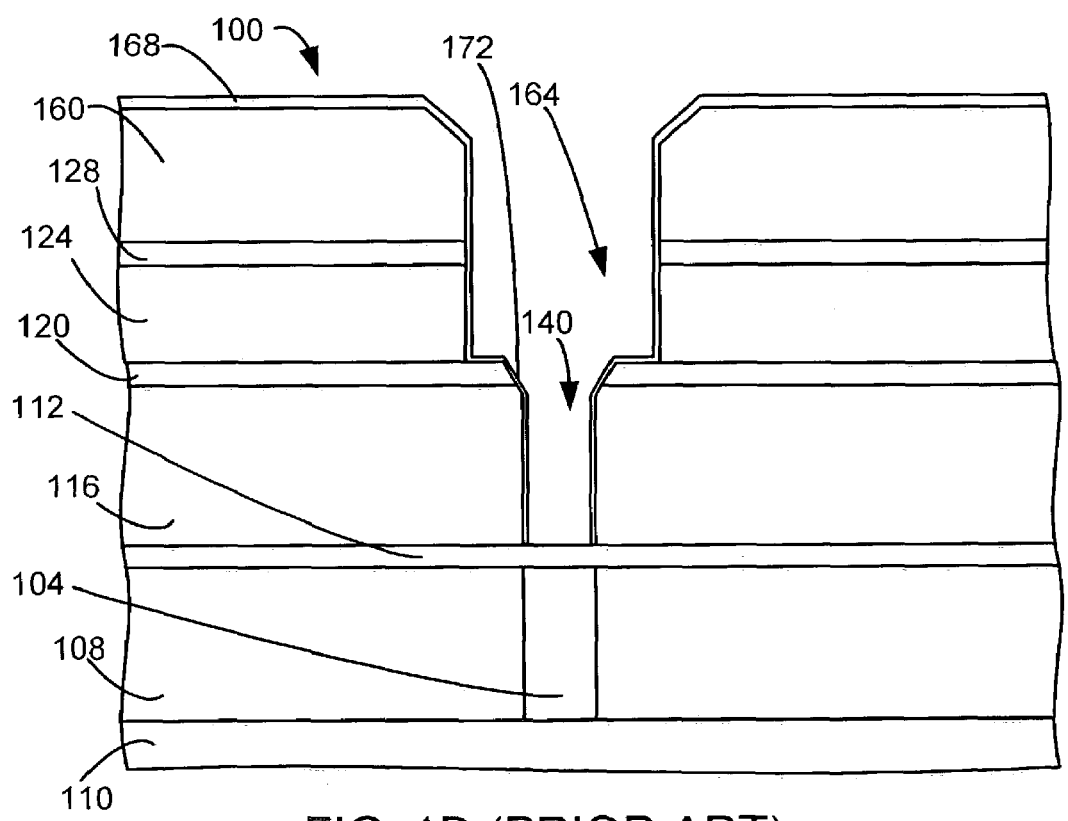
Figure 1E:
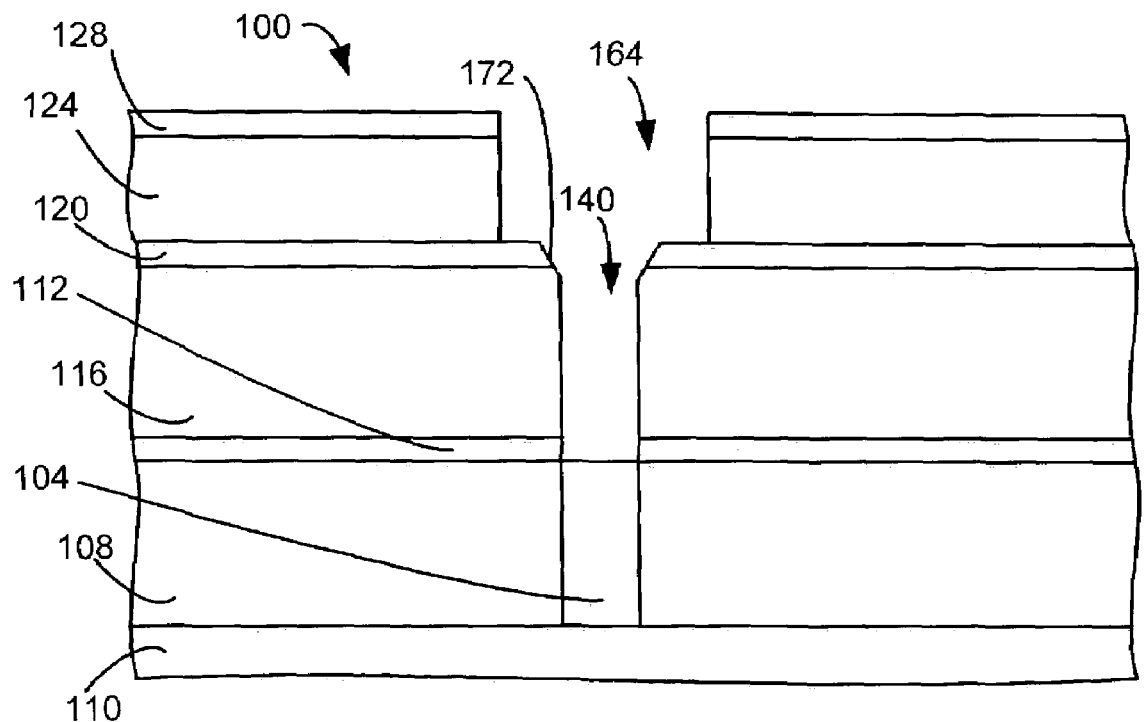
Figure 1F:
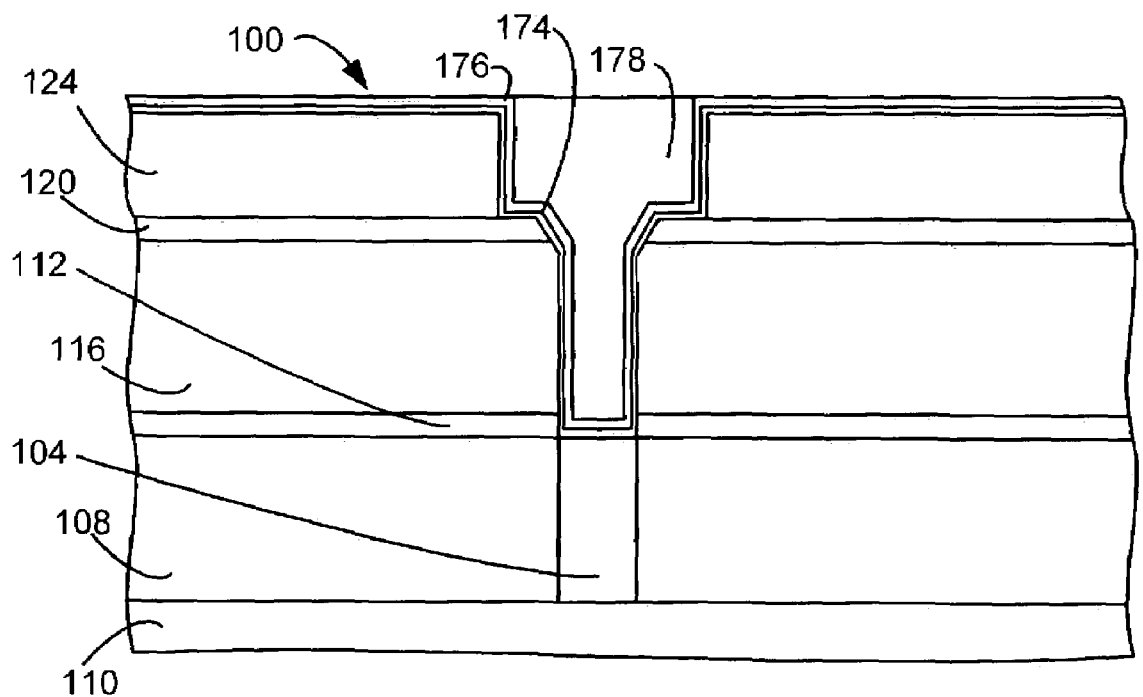
Figure 2:
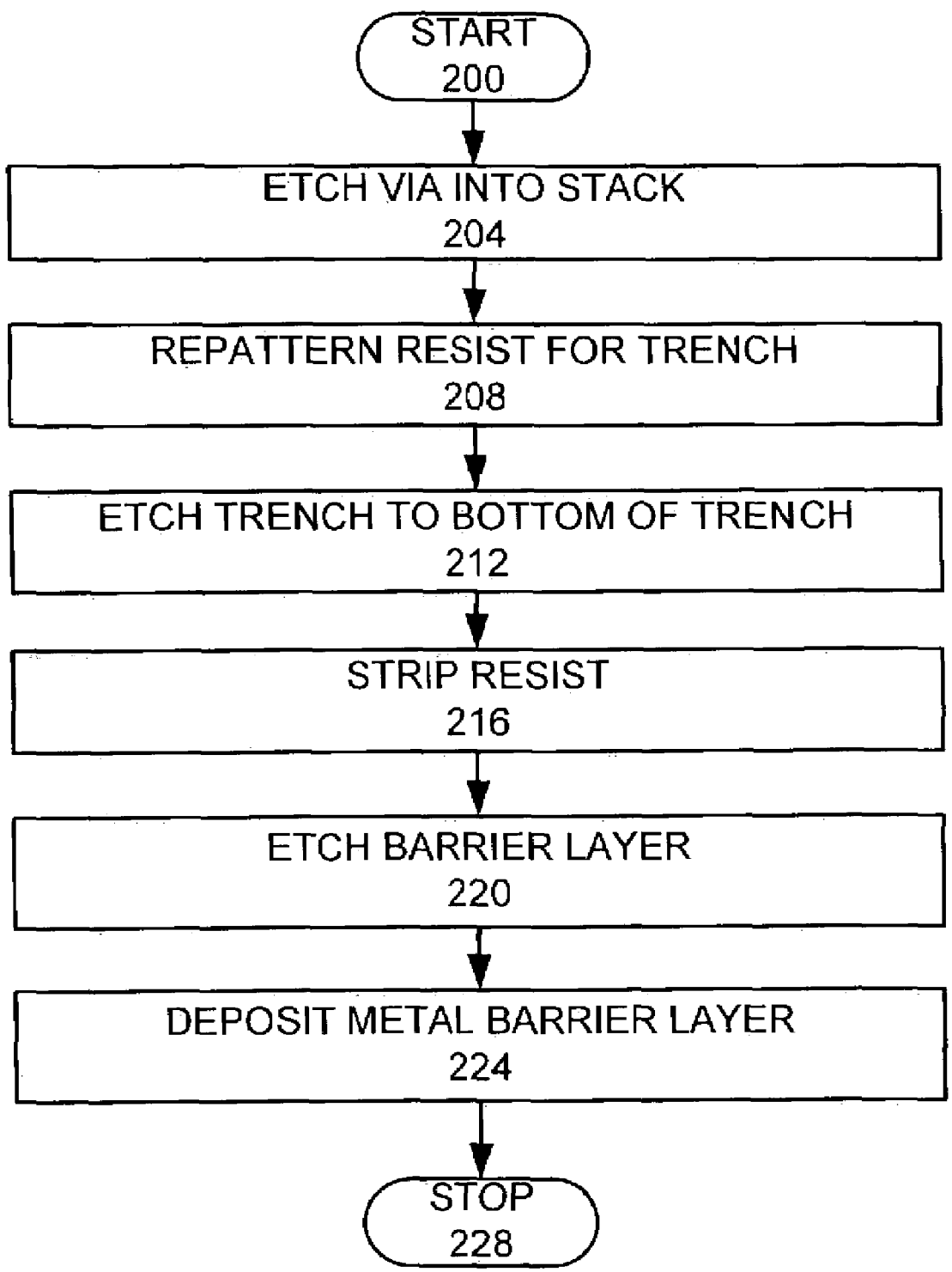
FIG. 2 is part of a flow chart of the formation of the damascene structure shown in FIGS. 1A–F.
Figure 3A:
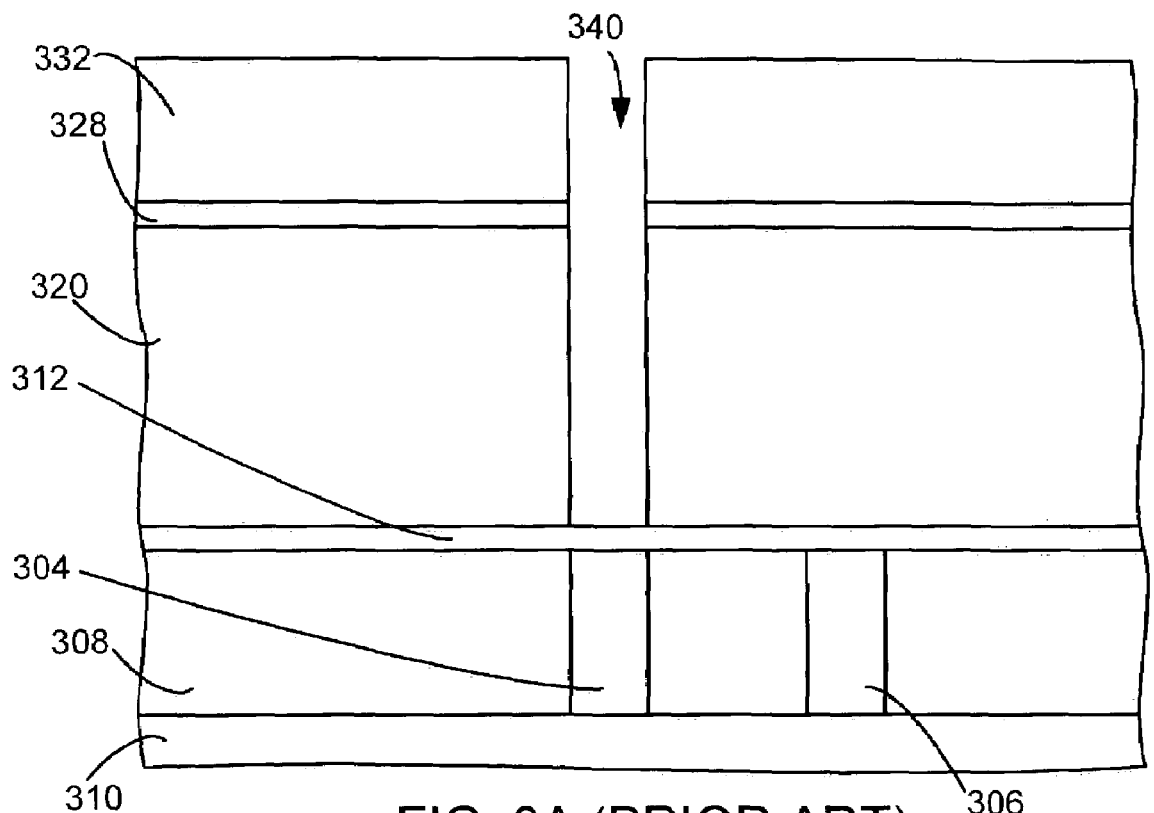
FIGS. 3A–B are schematic views of the formation of a damascene structure using another method in the prior art.
Figure 3B:
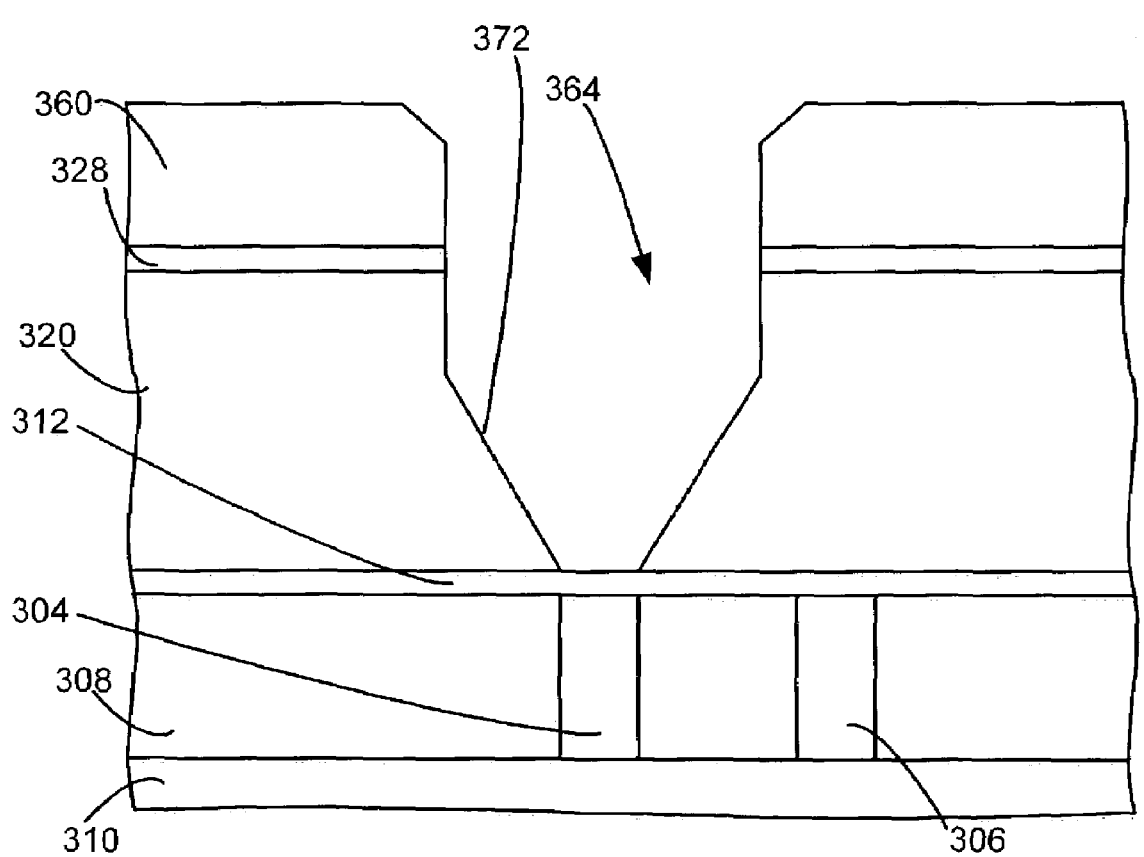
Figure 4A:
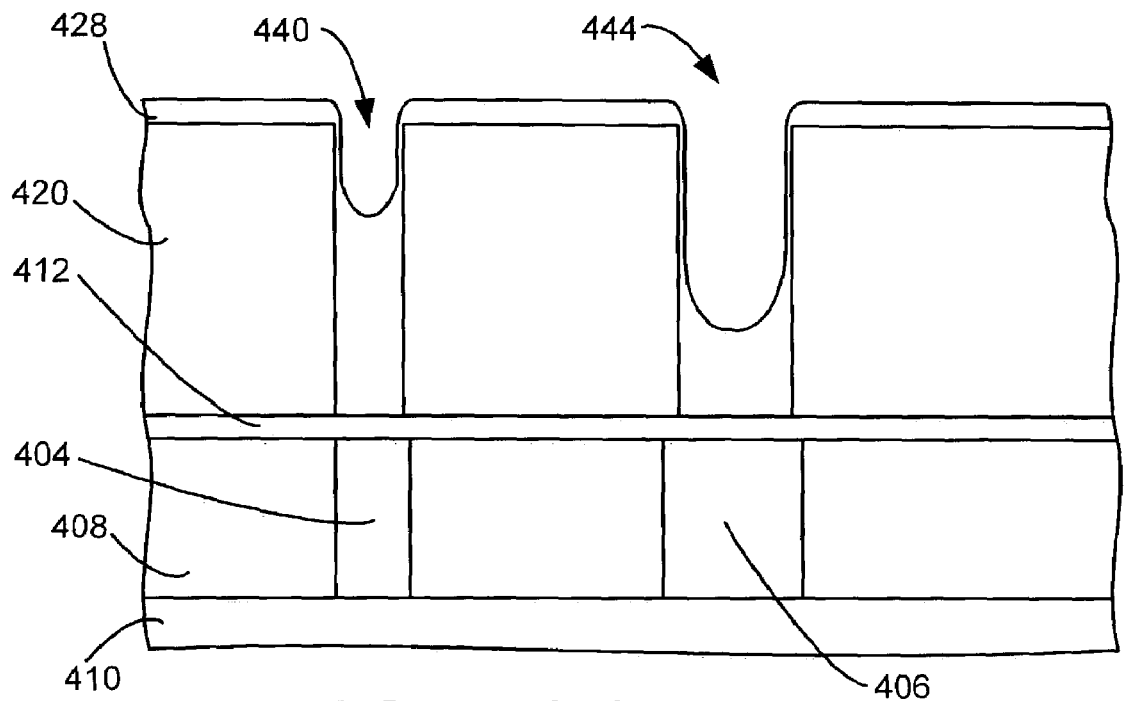
FIGS. 4A–B are schematic views of the formation of a damascene structure using another method in the prior art
Figure 4B:
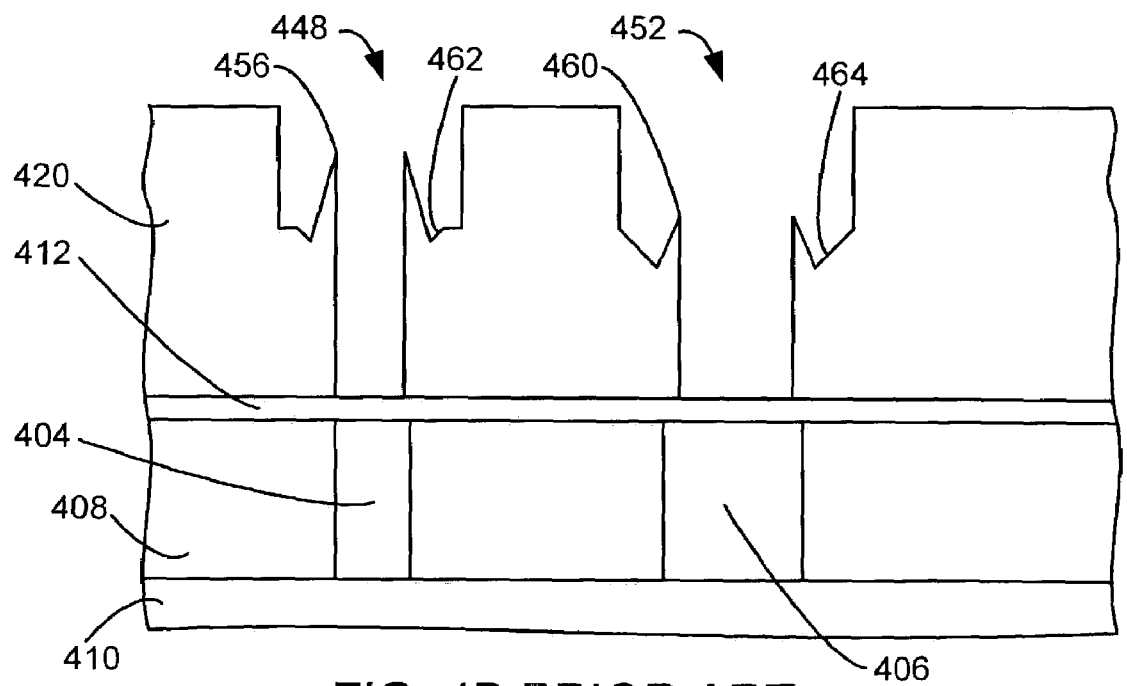
Figure 5:
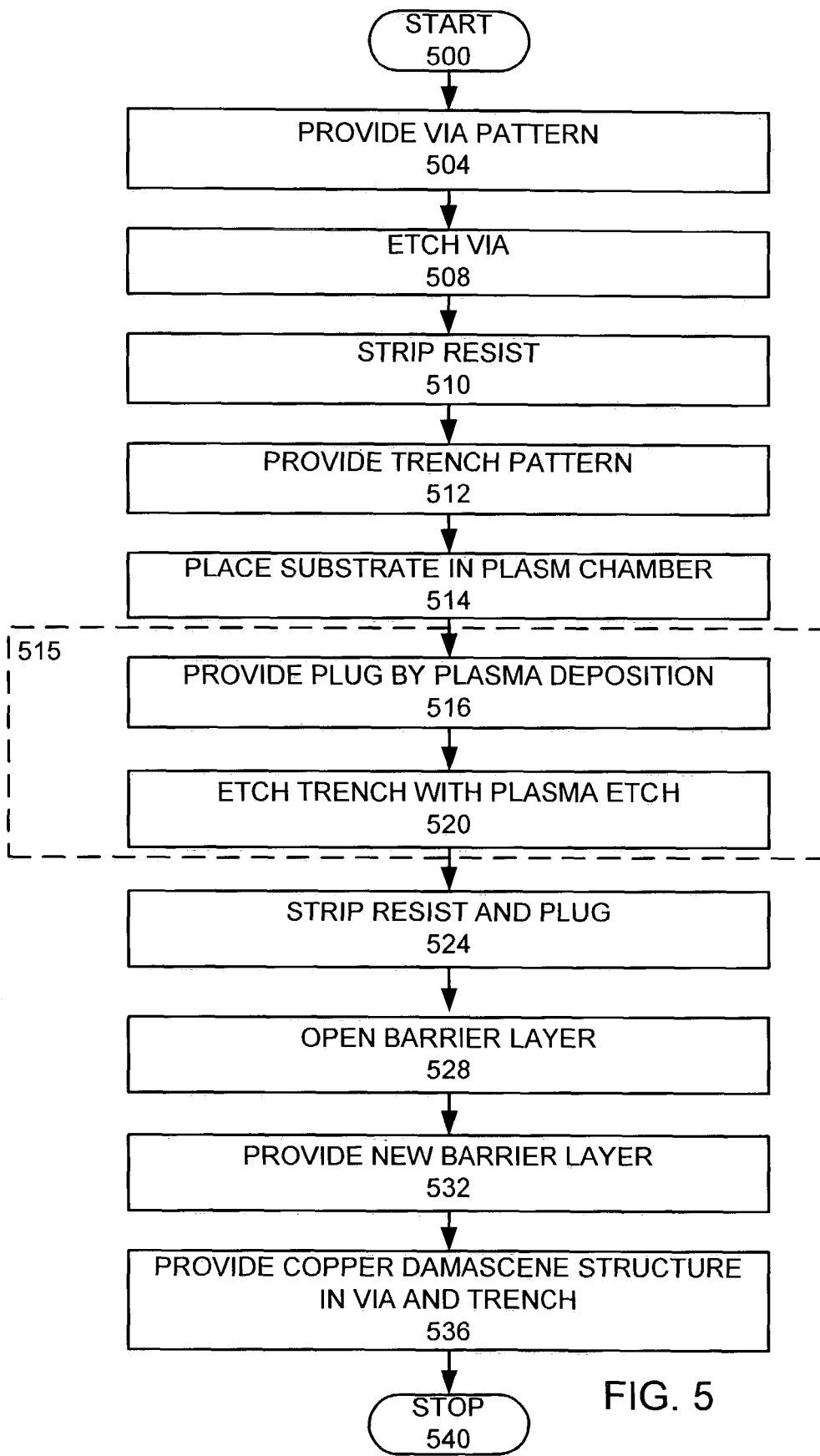
FIG. 5 is a high level flow chart of a process used in an embodiment of the invention.
Figure 6A:
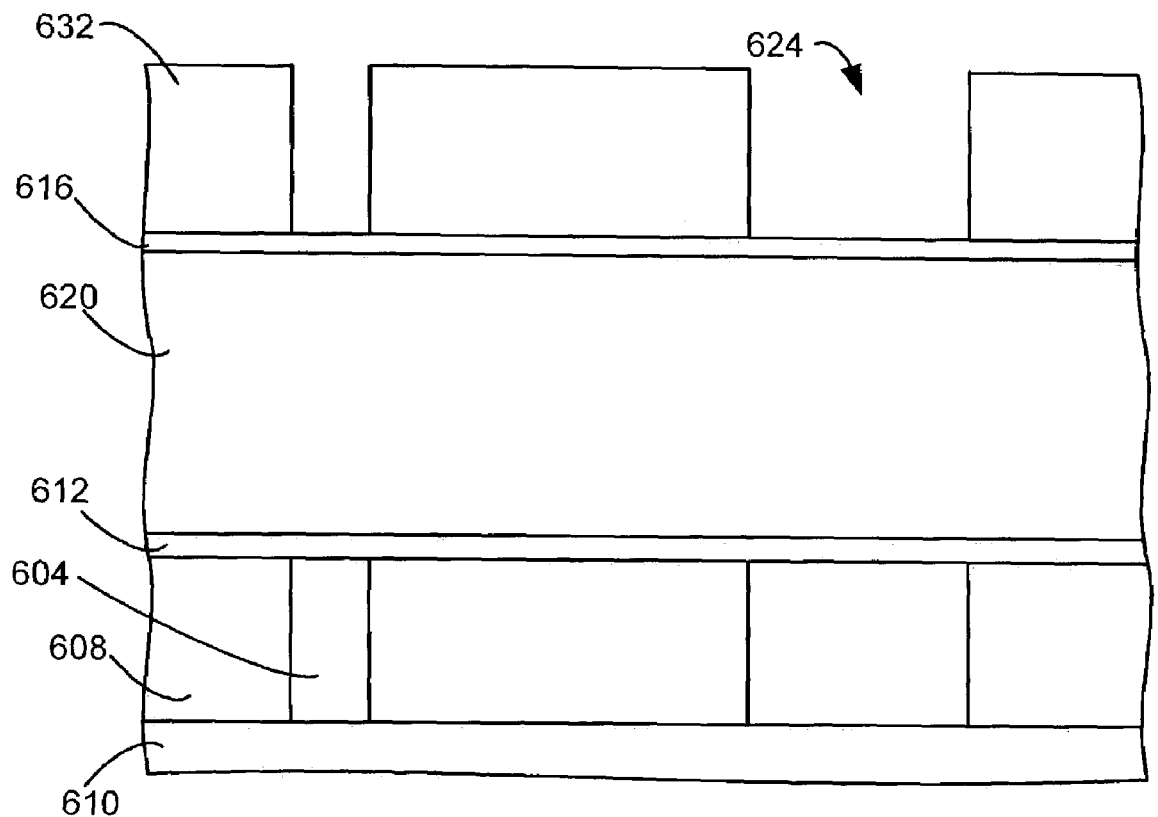
FIGS. 6A–G are schematic views of the formation of a damascene structure using the method shown in FIG. 5.

To facilitate understanding, FIG. 5 is a high level flow chart of a process used in an embodiment of the invention. A via pattern is provided (step 504). FIG. 6A is a cross-sectional view of a low k dielectric layer 620 formed over a barrier layer 612, which is formed over another dielectric layer 608 with electrical contacts 604, which are formed over a wafer 610. Although the dielectric layer 608 is shown as being formed on the wafer 610, there may be any number of dielectric layers formed between the low k dielectric layer 620 and the wafer 610. In addition, the dielectric layer 608 and contacts 604 may have been previously formed using the present invention, so that the dielectric layer 608 may be a low k dielectric layer and the contacts 604 are part of a damascene structure. A barrier layer 612 may be formed over the dielectric layer 608 and contacts 604 to prevent copper from diffusing into a dielectric layer and causing copper poisoning. The barrier layer 612 may be a silicon carbide (SiC) layer or it may also be SiN. The low-k dielectric may be organosilicate dielectrics, including CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J.

The formation of the via pattern may be performed by forming an anti-reflective layer (ARL) 616 over the low-k dielectric layer 620. The ARL 616 may be formed by chemical vapor deposition (CVD). U.S. patent application Ser. No. 10/138,041, entitled "Method For Patterning Multilevel Interconnects," by Lassig et al., which is incorporated by reference for all purposes, discloses methods of forming an ARL and via pattern.

A photoresist layer 632 is formed over the ARL 616. The photoresist layer may be patterned by exposing the photoresist layer 632 to a patterned light and then developing the photoresist layer 632 to obtain a via aperture 624 in the photoresist layer 632.

Figure 6B:
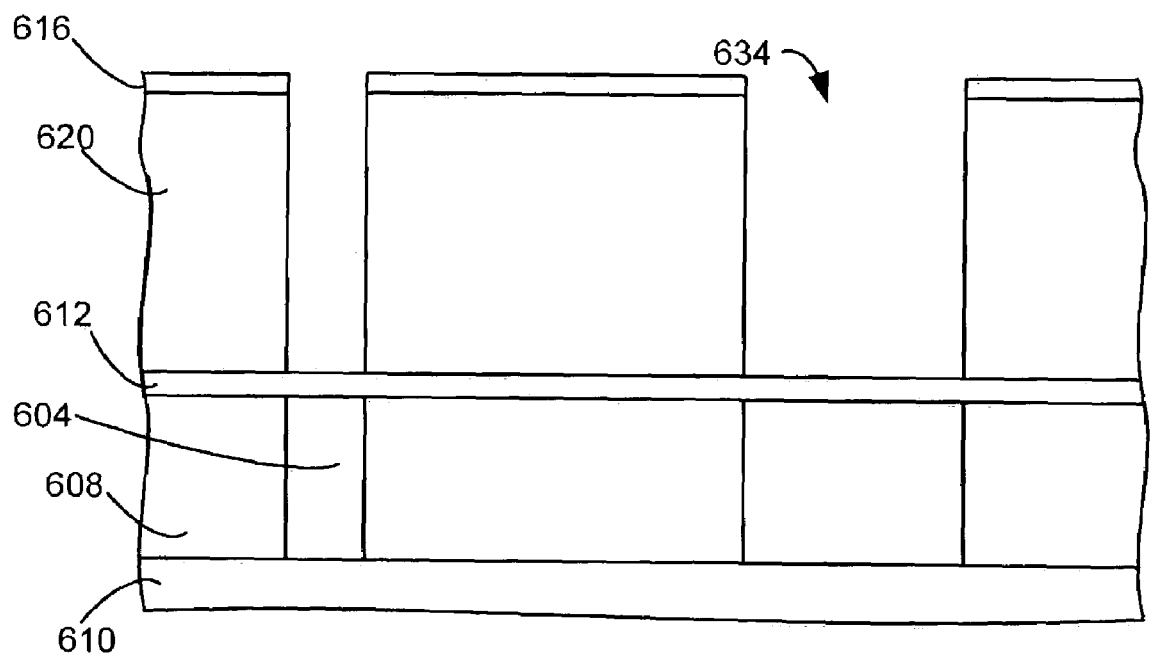

A via 634 is then etched through the low-k dielectric layer (step 508), as shown in FIG. 6B. The via etching may be performed in an Exelan HP™ or HPT™ available from Lam® Research Corporation, Fremont Calif., using an argon, $C_4F_8$, and nitrogen-etching chemistry. The resist layer is then stripped (step 510). The stripping may be done in the etching chamber, in a separate plasma stripping device, or as a wet strip.

Figure 6C:
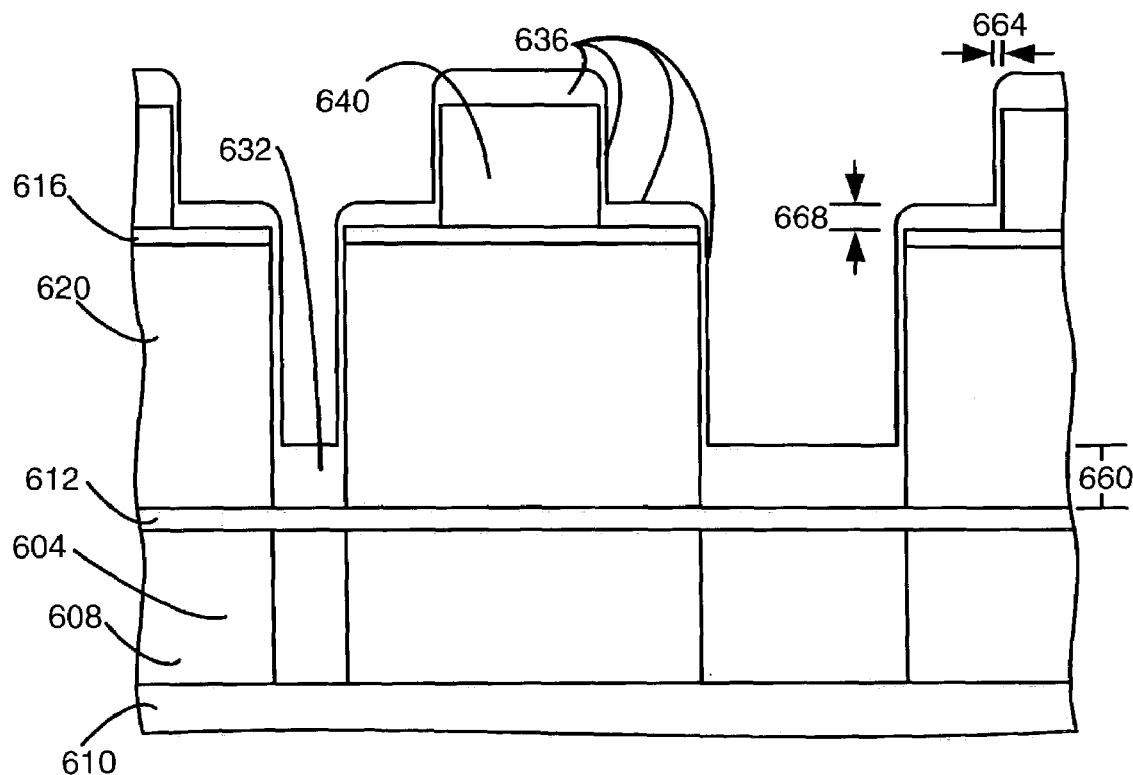

A trench pattern is then provided (step 512). A photoresist layer is placed over the ARL. The photoresist layer is patterned to form a trench-patterned photoresist layer 640, as shown in FIG. 6C.

Figure 7:
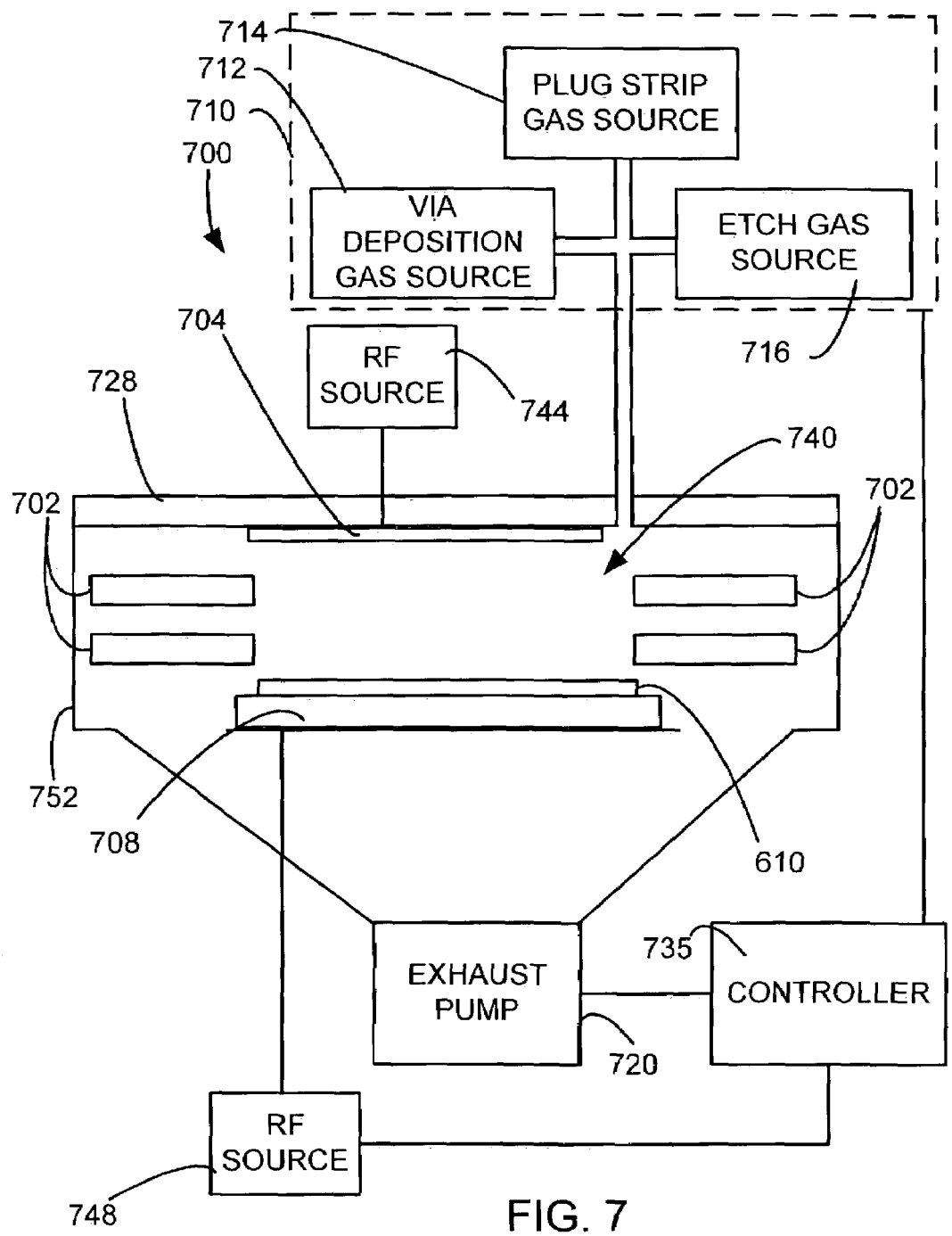
FIG. 7 is a schematic view of a plasma processing chamber that may be used for depositing plugs, etching, and stripping.

The substrate 610 is then placed in a plasma processing chamber (step 514). FIG. 7 is a schematic view of a plasma processing chamber 700 that may be used for depositing plugs, etching, and stripping. The plasma processing chamber 700 comprises confinement rings 702, an upper electrode 704, a lower electrode 708, a gas source 710, and an exhaust pump 720. The gas source 710 comprises a plug deposition gas source 712, a plug strip gas source 714, and an etching gas source 716. The gas source 710 may comprise additional gas sources, such as a different via etching gas source. Within plasma processing chamber 700, the substrate 610 is positioned upon the lower electrode 708. The lower electrode 708 incorporates a suitable substrate chucking mechanism (e.g., electrostatic, mechanical clamping, or the like) for holding the substrate 610. The reactor top 728 incorporates the upper electrode 704 disposed immediately opposite the lower electrode 708. The upper electrode 704, lower electrode 708, and confinement rings 702 define the confined plasma volume. Gas is supplied to the confined plasma volume by the gas source 710 and is exhausted from the confined plasma volume through the confinement rings 702 and an exhaust port by the exhaust pump 720. A first RF source 744 is electrically connected to the upper electrode 704. A second RF source 748 is electrically connected to the lower electrode 708. Chamber walls 752 surround the confinement rings 702, the upper electrode 704, and the lower electrode 708. Both the first RF source 744 and the second RF source 748 may comprise a 27 MHz power source and a 2 MHz power source. Different combinations of connecting RF power to the electrode are possible. In the case of Exelan HPT made by LAM Research Corporation™ of Fremont, Calif., which may be used in a preferred embodiment of the invention, both the 27 MHz and 2 MHz power sources make up the second RF power source 748 connected to the lower electrode, and the upper electrode is grounded. A controller 735 is controllably connected to the RF sources 744, 748, exhaust pump 720, and the gas source 710.

Figure 13A:
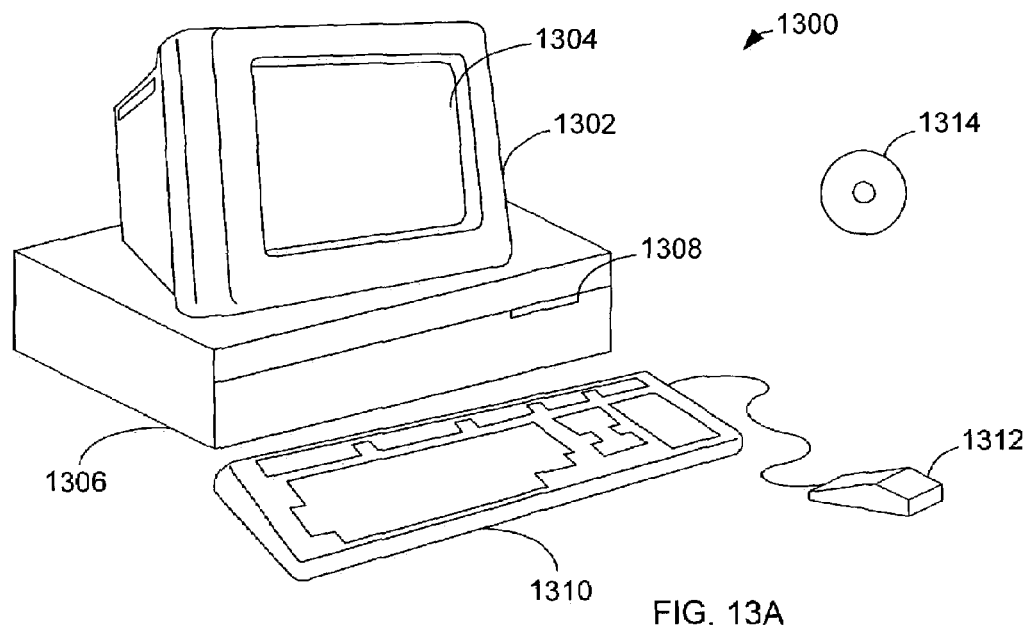
FIGS. 13A–B illustrate a computer system, which is suitable for implementing a controller used in embodiments of the present invention.
Figure 13B:
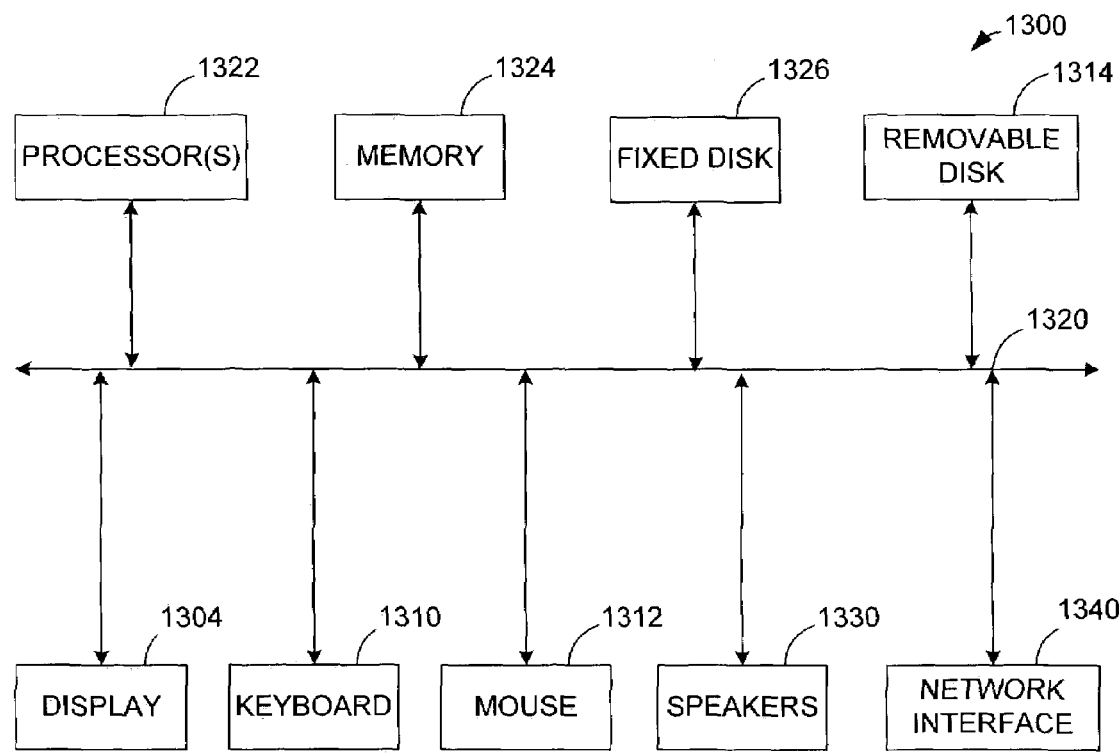

FIGS. 13A and 13B illustrate a computer system 1300, which is suitable for implementing a controller 735 used in embodiments of the present invention. FIG. 13A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 13B is an example of a block diagram for computer system 1300. Attached to system bus 1320 are a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A combination via plug deposition and trench etch step is performed (step 515) in the plasma chamber 700. To facilitate understanding, the combination via plug deposition and trench etch step (step 515) is shown as two subcomponent steps of via plug plasma deposition (step 516), using a plasma deposition, and trench etch (step 520), using a plasma etch. For the via plug deposition (step 516), a deposition gas is provided by the deposition gas source 712. The deposition gas source provides polymer former gases to form polymers of hydrocarbons, hydrofluorocarbons or fluorocarbons. More preferably, the deposition gas forms fluorocarbon polymers, which comprise hydrofluorocarbons and fluorocarbons. To form the fluorocarbon polymers the deposition gas source may provide different combinations of $C_xH_yF_z$ and/or $C_xF_y$, which for example may include one or more of $CF_4$, $C_4F_6$, $C_4F_8$, $CH_2F_2$, $CHF_3$ and $CH_3F$. In general, a higher C/F ratio would result in more deposition. Carbon is a source for deposition polymer and fluorine is a source for etching. Therefore it would be desirable to have more carbon than fluorine to provide sufficient deposition, and yet a high enough flow of fluorine to allow for trench etching. The electrodes 704, 708 are energized by the RF sources 744, 748 to transform the deposition gas into a plasma, which causes a polymer to deposit on the substrate to form polymer via plugs. Preferably, the plugs are a fluorocarbon polymer, which is a Teflon like polymer. FIG. 6C is a cross-sectional view of the stack after the polymer via plugs 632 have been deposited. The polymer forming the via plugs 632 may also be deposited as a layer 636 over the outer surfaces of the trench pattern 640, the ARL 616, and the sidewalls of the via. The via only needs to be partially filled with the polymer plug 632, since the subsequent etch would selectively etch the dielectric 620 over the polymer plug 632. By controlling the gas chemistries and other parameters lateral versus vertical deposition may be controlled. For plug fill applications, sidewall deposition may be minimized during bottom deposition. As a result of this minimization, the thickness 660 of the bottom plug is thicker than the thickness 664 of the sidewalls. More preferably, the thickness 660 of the bottom plug is greater than two times the thickness 664 of the sidewalls. Preferably the thickness 660 of the bottom plug is also thicker than the thickness 668 of a layer formed on a bottom surface of the trench.

The plasma chamber 700 is also used to provide the trench etch by plasma etching (step 520). An etching gas is provided by the etch gas source 716. The etch gas source may use oxygen as the active etchant. The oxygen acts as a scavenger for carbon, which is a deposition source, and reacts to form —CO, which is a volatile gas. This is one reason why adding $O_2$ results in less polymerizing and facilitates the etching of materials. In an alternative embodiment, $N_2$ may be used where fluorine is used as an active etchant. The etch gas may also have a $C_xH_yF_z$ component to form a protective layer while etching to control the feature profile. Generally, both etch and deposition may use an $O_2$, $C_xH_yF_z$, and $C_xF_y$ chemistry, where the etch chemistry has a greater amount or ratio of fluorine and oxygen to carbon than does the deposition chemistry. The etchant $O_2$ may be added to the deposition gas to control the deposition rate. Since the deposition gas and etch gas may comprise the same gases in different ratios, the via plug deposition gas source 712 and the etch gas source 716 may be a combination of the same gas sources with a control system that allows the provision of different gas ratios.

Figure 6D:
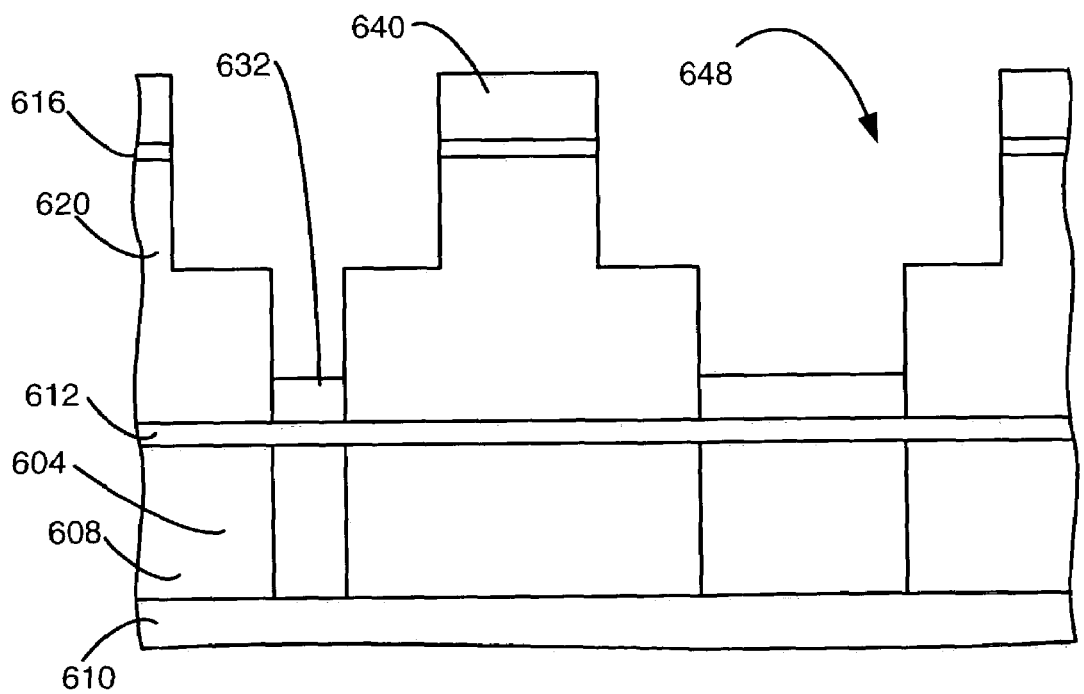

FIG. 6D is a cross-sectional view of the stack after the trenches 648 have been etched. Although the subcomponent steps are listed sequentially, various combinations of the subcomponent steps may be used to perform the combination via plug deposition and trench etch step. Some of these combinations may be a single deposition followed by a single etch, or a plurality of cycles of a plug deposition phase followed by a trench etch phase, or by performing the via plug deposition and trench etch simultaneously. These variations will be discussed in more detail below.

Figure 6E:
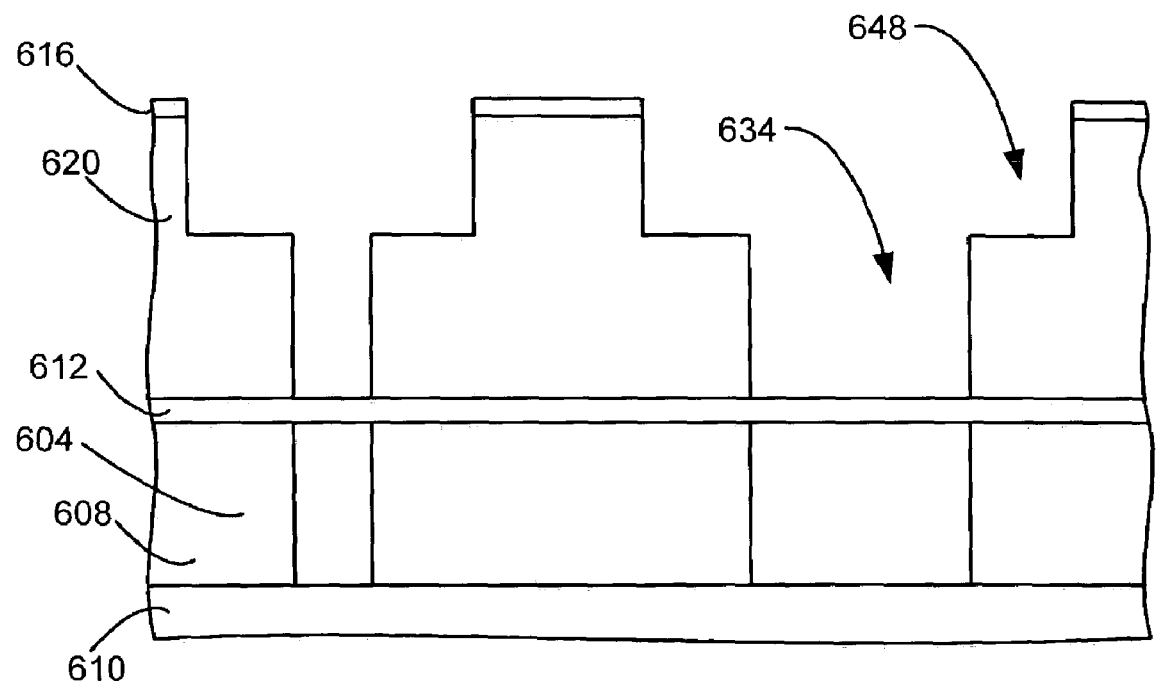

The remaining photoresist 640 and via plug 632 may be stripped (step 524). A plug strip gas is provided by the plug strip gas source 714. The photoresist and via plug strip may be an ashing step with an $O_2$ based ashing chemistry or with a $N_2/H_2$ based ashing chemistry. The deposition chemistry is selected to provide in-situ via plugs that can also be stripped off using conventional photoresist stripping processes. In various embodiments, one of two stripping processes may be used. One stripping process is $O_2$ based, which uses a high $O_2$ flow, on the order of 1000 sccms, and small amount of $N_2$, CO, or $CF_4$ containing chemistries, on the order of ~200 seems. The other stripping process is a $N_2/H_2$ based chemistry where high flows of $N_2$ and $H_2$ are used along with very small amount of $CF_4$. As a result, the via plugs and photoresist are stripped, as shown in FIG. 6E. Preferably, the strip is done in the same plasma chamber 700 as the plug deposition and trench etch (in-situ). By performing the steps of plug deposition, trench etch, and plug and photoresist strip in the same chamber without removing the substrate, faster through put may be provided. Other embodiments may use additional processes, such as a wet strip, or other processes to strip remaining plug material. Preferably the ARL layer 616 is stripped during the stripping of the photoresist 640 and the via plugs 632 (step 524).

Figure 6F:
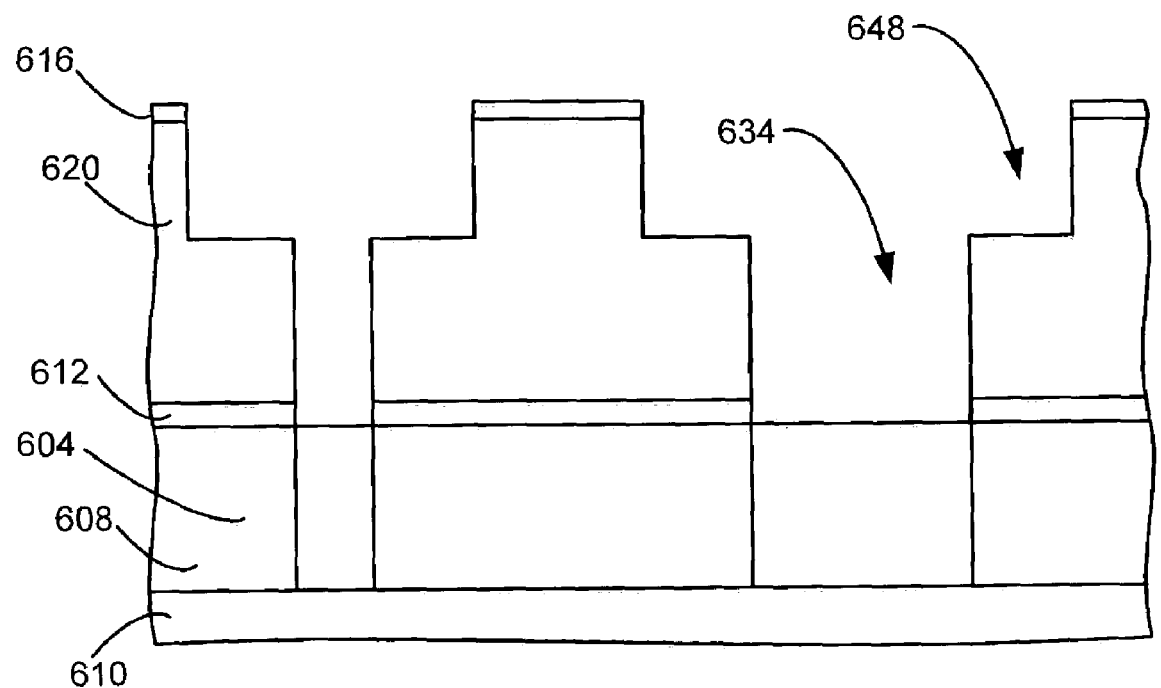

Next, a part of the barrier layer 612 over the contacts 604 is opened (step 528), as shown in FIG. 6F. This may be done in a single step by performing a nitrogen/hydrogen ($N_2/H_2$) etch with a carbon tetrafluoride ($CF_4$) additive. The amount of $CF_4$ additive may range from 1–25 sccm. More specifically, the amount of $CF_4$ additive may range from 2–10 sccm. More specifically, the amount of $CF_4$ may be about 5 sccm. The $CF_4$ additive may be provided to two liters per minute of other gases such as nitrogen and hydrogen. For silicon dioxide DD barrier layers, a $C_xH_yF_z$ gas chemistry, using such gases as, $CH_2F_2$, $CHF_3$, $CF_4$, $CH_3F$ with $O_2$ or $N_2$ additive gas may be used for opening the barrier layer. Such barrier etching may provide minimal faceting, cause minimal CD enlargement, and create minimal residue.

Figure 6G:
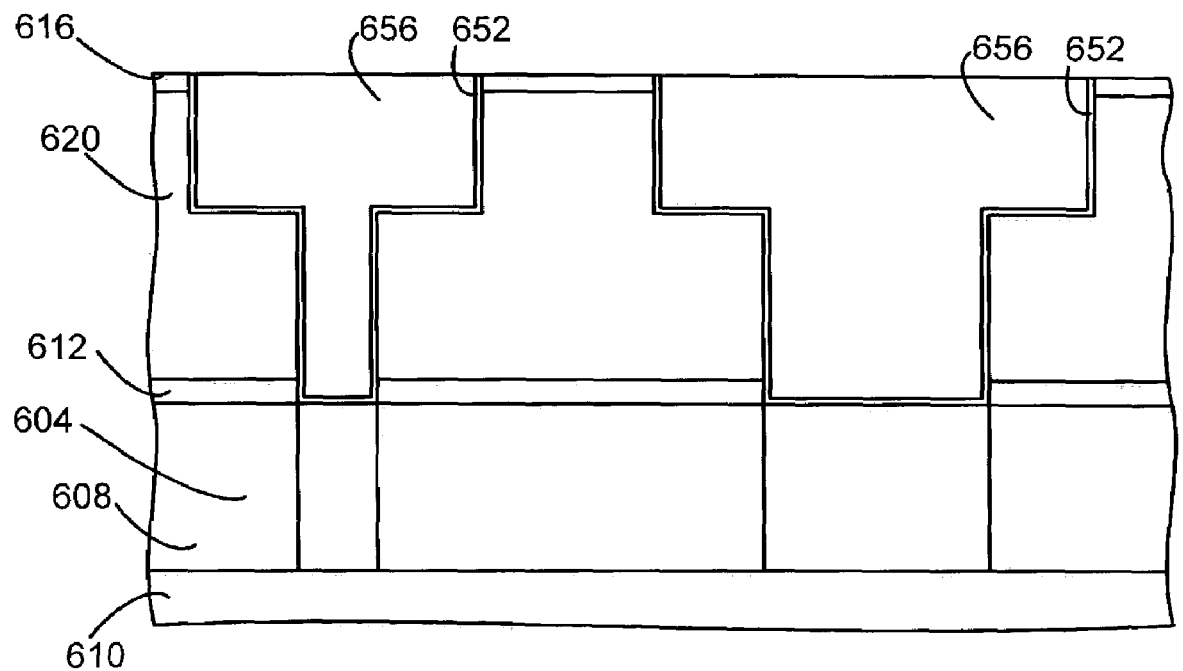

A new metal barrier layer 652 may be placed in the damascene structure to provide a copper barrier (step 532), as shown in FIG. 6G. Copper may then be provided to fill the damascene structure, forming a copper contact 656 (step 536).

Simultaneous Process

Figure 8:
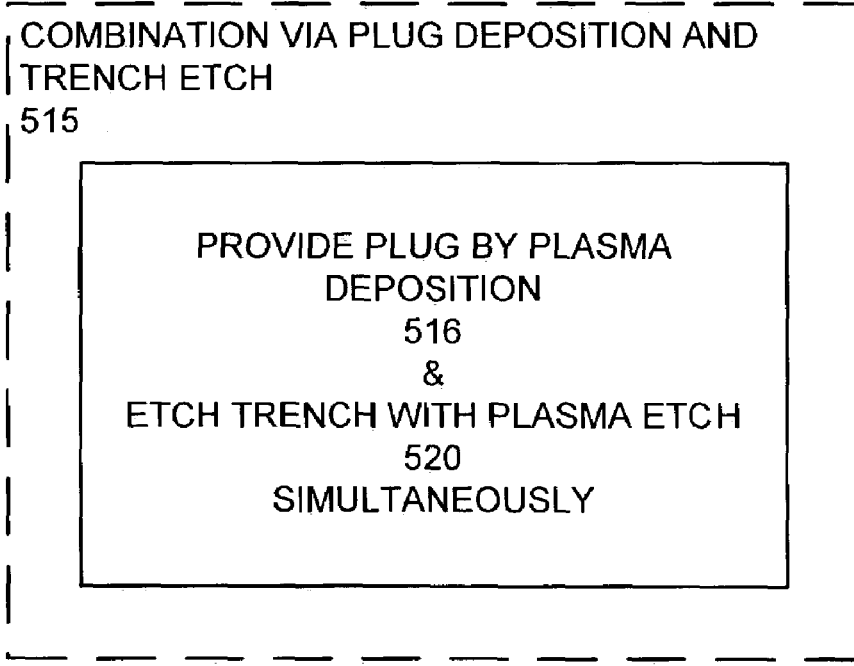
FIG. 8 is a more detailed flow chart of the combination via plug deposition and trench etch step in the form of a single simultaneous process.

FIG. 8 is a more detailed flow chart of the combination via plug deposition and trench etch step (step 515) in the form of a single simultaneous process. In this embodiment, the combination via plug deposition and trench etch step is a simultaneous process comprising a via plug deposition (step 516) and a trench etching (step 520) in a single process.

In a specific example of this step, the via plug deposition and the trench etch simultaneously performed by introducing into the plasma process chamber a plug formation gas and etching gas of 12 sccm $C_4F_8$, 4 sccm $O_2$, 5 sccm $CH_2F_2$, and 135 sccm argon in an Exelan HPT made by LAM Research Corporation™ of Fremont, Calif. The pressure in the plasma process chamber is maintained at about 50 mT with an HPT vat valve open to 150. A 27 MHz power source of RF source 748 connected to the lower electrode 708 provides 1200 Watts of power. A 2 MHz power source of RF source 748 connected to the lower electrode 708 provides 1800 Watts of power. A wafer or lower electrode temperature of 0° C. is maintained. A helium backside coolant in the lower electrode is maintained at 15 Torr. The deposition is preformed for a period of 120 seconds.

Other processes may deposit material as they etch, but tend to mainly deposit on sidewalls. What makes this process unique is that more net deposition occurs on the bottom of the via than on the sidewalls of the etch so that the deposition protects the barrier layer as it etches. This allows the omission of a plug fill step, allowing the process to directly proceed to trench etch with no plug fill step. Other trench etch processes that deposit mainly on the sidewall, where a trench etch is provided without any prior plugs protecting the barrier layer, would result in the punching through the barrier layer and the attacking of whatever that is underneath the barrier layer, which is typically Cu.

In one example of the above process, while 220 nm of Coral was etched, 106 nm of polymer was deposited on the bottom of the via during 2 minutes. In this case, the selectivity (coral etch and polymer deposition) is around 1:1. More preferably, the net deposition on the ratio of the etch to the deposition is between about 4:1 and 1:2, wherein the net deposition during a simultaneous deposition and etch is the deposit remaining while some of the deposited layer is etched away.

Figure 9:
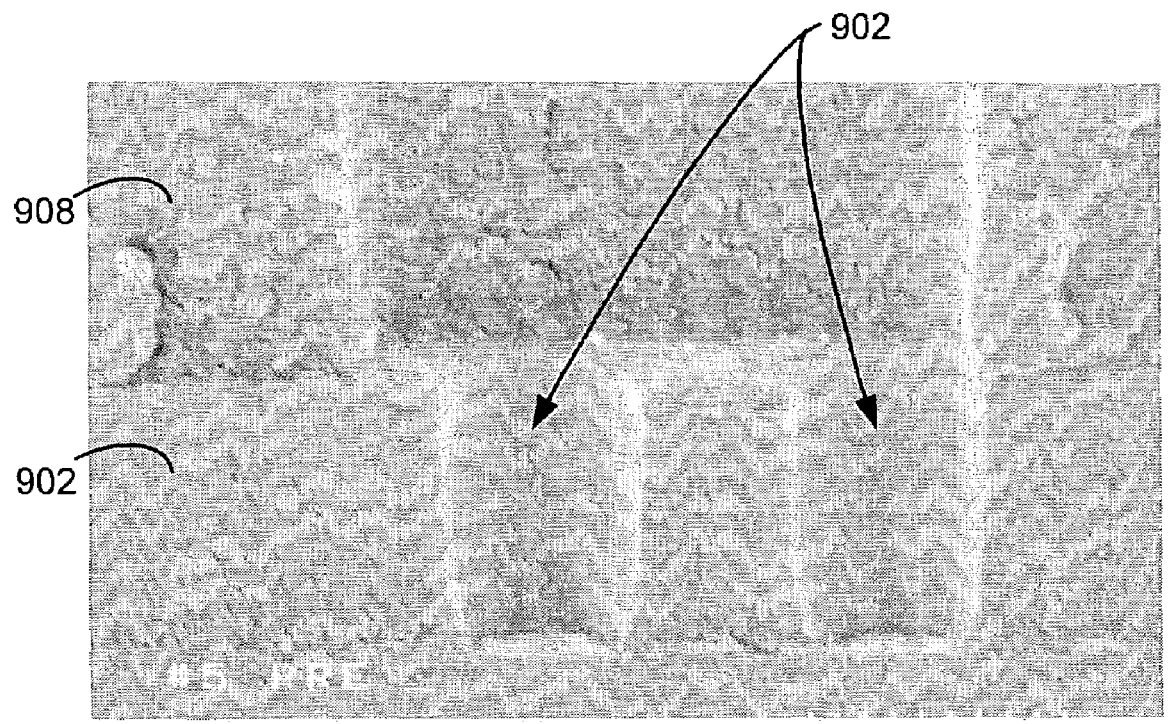
FIG. 9 is a scanning electron microscope (SEM) image of a stack with two vias with a photoresist with a trench pattern, before a combination via plug deposition and trench etch step.
Figure 10:
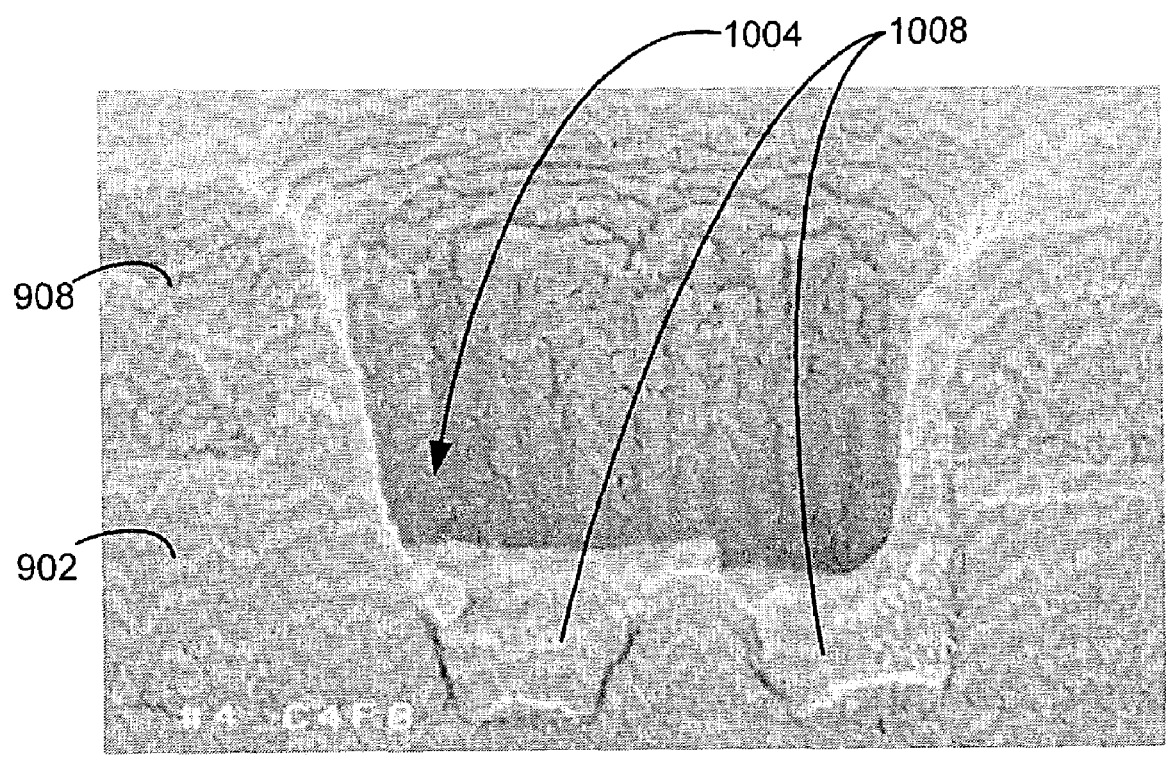
FIG. 10 is an SEM image of the stack with a trench etched after the combination via plug deposition and trench etch step.

FIG. 9 is a scanning electron microscope (SEM) image of a stack 902 with two vias 904 with a photoresist 908 with a trench pattern, before the combination via plug deposition and trench etch step (step 515). FIG. 10 is an SEM image of the stack 902 with a trench 1004 etched after the combination via plug deposition and trench etch step (step 515), using the above mentioned recipe. The remaining portions of the vias are filled with plugs 1008 formed during the combination via plug deposition and trench etch step (step 515). As shown, in this embodiment, the combination via plug deposition and trench etch step (step 515) forms a plug not just a deposition layer that is etched away during the combination via plug deposition and trench etch step (step 515). These figures show that the invention reduces or eliminates fences and faceting.

Cyclic Process

Figure 11:
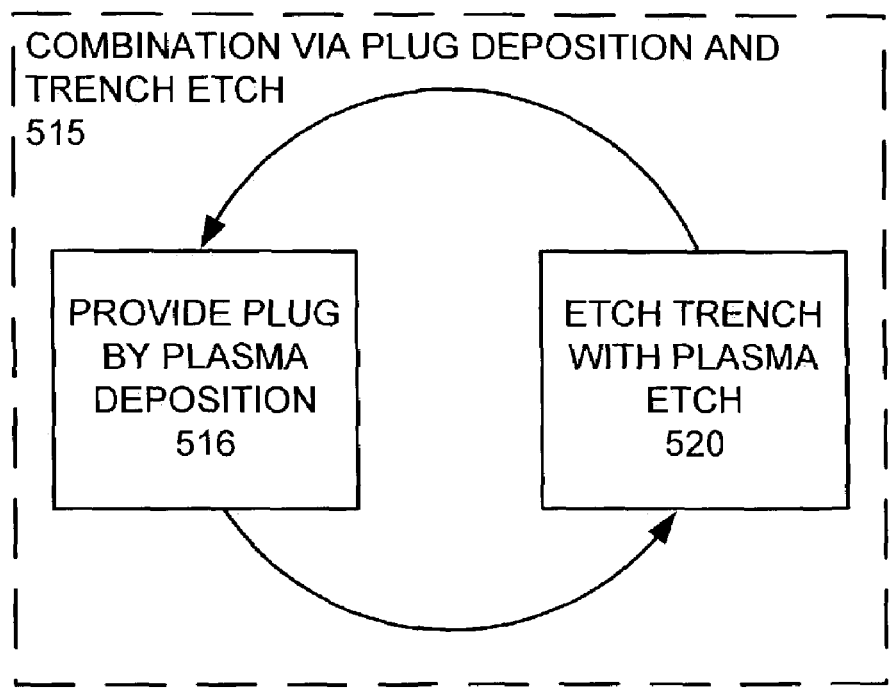
FIG. 11 is a more detailed flow chart of the combination via plug deposition and trench etch step in the form of a cycle.

FIG. 11 is a more detailed flow chart of the combination via plug deposition and trench etch step (step 515) in the form of a cycle. In this embodiment, the combination via plug deposition and trench etch step is a cyclic process comprising a via plug deposition phase (step 516) and a trench etch phase (step 520). The cycle is repeated for a number of times. Preferably, the number of times that the cycle is repeated is more than three times. Therefore this process does not require an additional fence removal step.

Two Step Process

Figure 12:
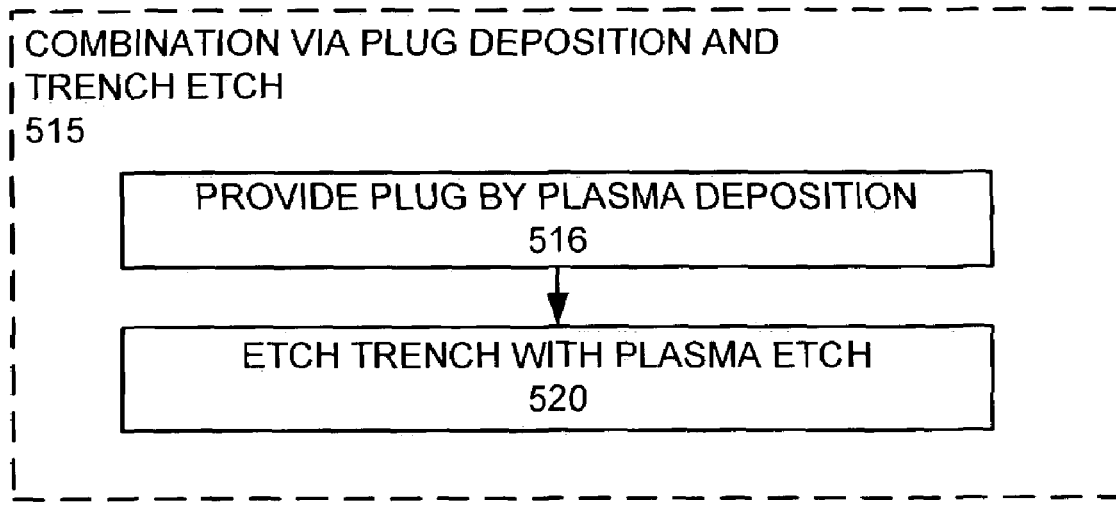
FIG. 12 is a more detailed flow chart of the combination via plug deposition and trench etch step in the form of a two step process.

FIG. 12 is a more detailed flow chart of the combination via plug deposition and trench etch step (step 515) in the form of a two step process. In this embodiment, the combination via plug deposition and trench etch step is a two step process comprising a single via plug deposition step (step 516) followed by single a trench etch step (step 520).

For a process providing via plug deposition only (step 516), for a high frequency power source, such as a 27 MHz power source, the power provided would be between 50–1800 Watts. For a low frequency power source, such as a 2 MHz power source, the power provided would be between about 0–500 Watts. More preferably, the low frequency power source provides a power of about 0–100 Watts. Most preferably, the low frequency power source provides a power of about 0 Watts. Preferably, the high frequency power source provides a power signal with a frequency greater than 10 times the frequency of a signal provided by the low frequency power source.

For a process of etching a trench in coral only using a 248 nm photoresist material (step 520) for the high frequency power source, a power of about 400 Watts is provided. For the low frequency power source, a power of about 600 Watts is provided. The 600 Watt power for the low frequency power source provides a high energy bias to facilitate etching. An etch gas with a chemistry of 12 sccm $O_2$, 7 sccm $C_4F_8$, and 70 sccm Ar is provided. The pressure is maintained at about 150 mTorr by opening the HPT vat valve to 83. The etching is carried out for 43 seconds.

For a process of etching a trench in coral only using a 193 nm photoresist material (step 520) for the high frequency power source, a power of about 300 Watts is provided. For the low frequency power source, a power of about 300 Watts is provided. The 300 Watt power for the low frequency power source provides a high energy bias to facilitate etching. An etch gas with a chemistry of 5 sccm $O_2$, 7 sccm $CF_4$, 40 sccm $CHF_3$, and 500 sccm Ar is provided. The pressure is maintained at about 160 mTorr by opening the HPT vat valve to 1,000.

Other embodiments of the invention may use other types of plasma process chambers, such as the 2300 Excelan made by Lam Research Inc.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming scene features in a dielectric layer over a barrier layer over a substrate, comprising:
    etching a plurality of vias in the dielectric layer to the barrier layer with a plasma etching process in a plasma processing chamber;
    form a patterned photoresist layer with a trench pattern;
    within a single plasma process chamber providing a combination via plug deposition to form plugs in the vias over the barrier layer and trench etch, wherein the providing the combination via plug deposition to form plugs in the vias and trench etch, comprises providing a plug forming gas and an active etchant in the plasma process chamber simultaneously and forming a plasma from the plug forming gas and the active etchant.

2. The method, as recited in claim 1, wherein the via plugs are formed by a plasma deposition.

3. The method, as recited in claim 2, wherein the via plugs are made of a fluorocarbon polymer.

4. The method, as recited in claim 3, further comprising a photoresist and via plug strip within the plasma process chamber subsequent to the providing the combination via plug deposition and trench etch.

5. The method, as recited in claim 4, her comprising opening a barrier layer within the plasma process chamber subsequent to the photoresist and via plug strip.

6. The method, as recited in claim 5, further comprising a depositing a feature barrier layer subsequent to opening the barrier layer, wherein the feature barrier layer is deposited over the substrate when the substrate is within the plasma process chamber.

7. A method for forming damascene features in a dielectric layer over a barrier layer over a substrate, comprising:
    etching a plural of vias in the dielectric layer to the barrier layer with a plasma etching process in a plasma processing chamber;
    forming a patterned photoresist layer with a trench pattern;
    within a single plasma process chamber providing a combination via plug deposition to form plugs in the vias over the barrier layer and trench etch wherein the via plugs are formed by a plasma deposition, wherein the via plugs are made of a fluorocarbon polymer, wherein the providing the combination via plug deposition to form plugs in the vias and trench etch, comprises providing a plug forming gas and an active etchant in the plasma process chamber simultaneously and forming a plasma from the plug forming gas and the active etchant;
    a photoresist and via plug strip within the plasma process chamber subsequent to the providing the combination via plug deposition and trench etch; and
    opening a barrier layer within the plasma process chamber subsequent to the photoresist and via plug strip.

8. A method for forming damascene features in a dielectric layer over a barrier layer over a substrate, comprising:
    etching a plurality of vias in the dielectric layer to the barrier layer with a plasma etching process in a plasma processing chamber;
    forming a patterned photoresist layer with a trench pattern;
    with a single plasma process chamber providing a combination via plug deposition to form plugs in the vias over the barrier layer and trench etch, wherein the via plugs are formed by a plasma deposition, wherein the via plugs are made of a fluorocarbon polymer, wherein the providing the combination via plug deposition to form plugs in the vias and trench etch, comprises providing a cyclic process with a via plug formation phase and a trench etch phase, wherein the cycle is performed more than three times;
    a photoresist and via plug strip within the plasma process chamber subsequent to the providing the combination via plug deposition and trench etch; and
    opening a barrier layer within the plasma process chamber subsequent to the photoresist and via plug strip.

9. The method, as recited in claim 8, wherein in the via plug formation phase comprises:
    providing a via plug formation gas comprising $C_4F_8$, $CH2F_2$, Ar, and $O_2$ to the plasma process chamber; and
    forming a plasma from the via plug formation gas; and
    wherein the trench etch phase, comprises:
    providing a trench etch gas comprising $CF_4$, $CHF_3$, and $O_2$ to the plasma process chamber; and
    forming a plasma from the via plug formation gas.

10. The method, as recited in claim 5, wherein the plasma deposition forming the via plugs deposits more on the bottoms of the vias than on sidewalls of the vias.

11. The method, as recited in claim 5, wherein the photoresist and via plug strip is provided by an ashing process.

12. The method, as recited in claim 11, wherein the ashing process is selected from the group of an $O_2$ based ashing and an $N_2/H_2$ based ashing.

13. The method, as recited in claim 5, wherein the providing a combination via plug deposition and trench etch, comprises providing a gas selected from the group comprising a fluorocarbon and a hydrofluorocarbon.

14. The method, as recited in claim 12, wherein the gas further comprises an inert carrier gas and an additive gas selected from the group comprising oxygen and hydrogen.

15. The method, as recited in claim 2, wherein each of the plurality of vias have sidewalls and bottoms, wherein the via plug deposition deposits a thicker layer on the bottoms of the vias than on the sidewalls.

16. A semiconductor device formed by the method as recited in claim 1.

17. A method for forming damascene features in a dielectric layer over a barrier layer over a subs, comprising:
    etching a plurality of vias in the dielectric layer to the barrier layer with a plasma etching process in a plasma processing chamber;

forming a patterned photoresist layer with a trench pattern; and within a single plasma process chamber providing a combination via plug deposition to form plugs in the vias over the barrier layer and trench etch, wherein the providing the combination via plug deposition to form plugs in the vias and trench etch, comprises providing a cyclic process with a via plug formation phase and a trench etch phase, wherein the cycle is performed more than three times.

* * * * *